(12) United States Patent
Wang et al.

(10) Patent No.: US 10,892,317 B2
(45) Date of Patent: Jan. 12, 2021

(54) POWER TRENCH CAPACITOR COMPATIBLE WITH DEEP TRENCH ISOLATION PROCESS

(71) Applicant: GLOBALFOUNDRIES Singapore Pte. Ltd., Singapore (SG)

(72) Inventors: Zeng Wang, Singapore (SG); Wei Si, Singapore (SG); Jeoung Mo Koo, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/432,540

(22) Filed: Jun. 5, 2019

(65) Prior Publication Data

US 2019/0288057 A1    Sep. 19, 2019

Related U.S. Application Data

(62) Division of application No. 15/441,776, filed on Feb. 24, 2017, now Pat. No. 10,355,072.

(51) Int. Cl.
| | |
|---|---|
| *H01L 49/02* | (2006.01) |
| *H01L 21/761* | (2006.01) |
| *H01L 21/762* | (2006.01) |
| *H01L 21/285* | (2006.01) |
| *H01L 27/06* | (2006.01) |

(52) U.S. Cl.
CPC ............ *H01L 28/40* (2013.01); *H01L 21/285* (2013.01); *H01L 21/761* (2013.01); *H01L 21/76224* (2013.01); *H01L 21/76229* (2013.01); *H01L 27/0629* (2013.01)

(58) Field of Classification Search
CPC ............... H01L 28/40; H01L 21/32135; H01L 21/76224; H01L 27/0805
See application file for complete search history.

(56) References Cited

U.S. PATENT DOCUMENTS

| | | | |
|---|---|---|---|
| 5,989,952 A | 11/1999 | Jen et al. | |
| 6,291,286 B1 * | 9/2001 | Hsiao | H01L 27/10867 257/E21.653 |
| 7,468,307 B2 | 12/2008 | Hartner et al. | |
| 8,208,908 B2 * | 6/2012 | Zaffino | H04M 1/72519 455/414.1 |
| 10,121,849 B2 | 11/2018 | Wu et al. | |

(Continued)

*Primary Examiner* — Dale E Page
*Assistant Examiner* — Wilner Jean Baptiste
(74) *Attorney, Agent, or Firm* — Ditthavong & Steiner P.C.

(57) ABSTRACT

A method for forming a trench capacitor without an additional mask adder and the resulting device are provided. Embodiments include forming a buried implant layer over a substrate; forming an EPI layer over the buried implant layer; forming an oxide layer over the EPI layer; forming a nitride layer over the oxide layer; forming first and second trenches in the nitride layer, the oxide layer, the EPI layer, the buried implant layer and the substrate, the first trench being wider and deeper than the second trench; forming a dielectric layer in the trenches; forming a first polysilicon layer over the dielectric layer in the trenches; removing the first polysilicon layer and the dielectric layer above the EPI layer in the trenches and at a bottom of the first trench; and forming a second polysilicon layer filling the first trench and above the EPI layer in the second trench.

18 Claims, 6 Drawing Sheets

(56) References Cited

U.S. PATENT DOCUMENTS

| | | |
|---|---|---|
| 2008/0164516 A1 | 7/2008 | Darwish |
| 2008/0283890 A1* | 11/2008 | Dyer .................. H01L 27/1087 |
| | | 257/301 |
| 2011/0159681 A1 | 6/2011 | Hwang et al. |
| 2012/0153431 A1* | 6/2012 | Anderson ......... H01L 27/10897 |
| | | 257/508 |
| 2012/0299152 A1 | 11/2012 | Kemerer et al. |
| 2016/0149011 A1 | 5/2016 | Hu et al. |

* cited by examiner

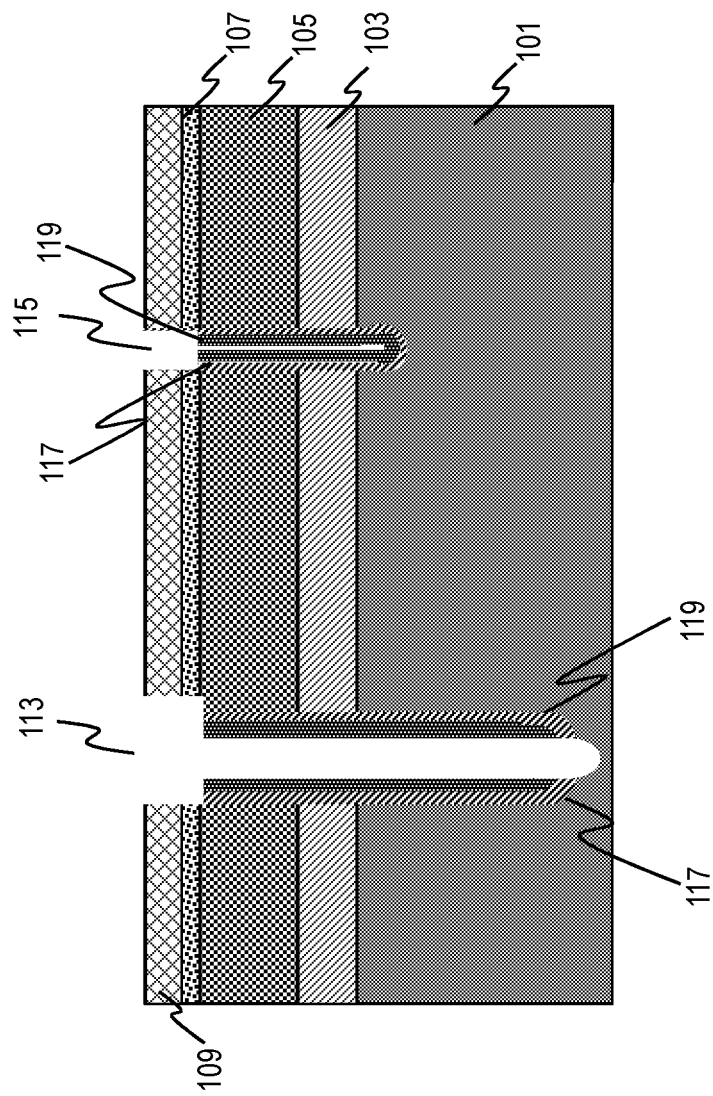

POWER TRENCH CAPACITOR COMPATIBLE WITH DEEP TRENCH ISOLATION PROCESS

RELATED APPLICATION

The present application is a Divisional of U.S. application Ser. No. 15/441,776, filed on Feb. 24, 2017, which is incorporated herein by reference in its entirety.

TECHNICAL FIELD

The present disclosure relates to the manufacture of semiconductor devices, such as integrated circuits (ICs). The present disclosure is particularly applicable to high voltage ICs utilizing deep trench isolation (DTI) structures.

BACKGROUND

Semiconductor manufacturing process involves forming and configuring structures of electronic elements in and on a semiconductor substrate. Each of these electronic elements must be isolated from the others to avoid shorting the circuits, for example, a high voltage device embedded in a substrate must be electrically isolated from the surrounding substrate. Trench isolation techniques, such as shallow trench isolation (STI) and DTI, have been developed to prevent these electronic elements from interfering with each other. As a result, the high voltage is contained within the high voltage device and does not negatively impact the surrounding devices and the package. In addition, some IC devices benefit from power capacitors. To increase the density, deep trench capacitors have been developed. However, fabrication of deep trench capacitors has required additional masks, which adds to the cost and complexity of manufacturing the circuit.

A need therefore exists for a methodology enabling formation of deep trench capacitors without the use of additional masks and the resulting device.

SUMMARY

An aspect of the present disclosure is a method of forming a trench capacitor compatible with a DTI process, without an additional mask adder.

Another aspect of the present disclosure is a device including a DTI structure and a deep trench capacitor without additional mask adder.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a buried implant layer over a substrate; forming an epitaxial (EPI) layer over the buried implant layer; forming an oxide layer over the EPI layer; forming a nitride layer over the oxide layer; forming first and second trenches in the nitride layer, the oxide layer, the EPI layer, the buried implant layer and the substrate, the first trench being wider and deeper than the second trench; forming a dielectric layer in the first and second trenches; forming a first polysilicon layer over the dielectric layer in the first and second trenches; removing the first polysilicon layer and the dielectric layer above the EPI layer in the first and second trenches and at a bottom of the first trench; and forming a second polysilicon layer filling the first trench and above the EPI layer in the second trench.

Another aspect includes forming the dielectric layer and the first polysilicon layer by: depositing a dielectric material and a first polysilicon material consecutively over the nitride layer and in the first and second trenches; and etching the dielectric material and the first polysilicon material back to an upper surface of the nitride layer. Further aspects include removing the first polysilicon layer and the dielectric layer above an upper surface of the EPI layer in the first and second trenches and at a bottom of the first trench by etching concurrently the dielectric material and the first polysilicon material back to an upper surface of the nitride layer. Additional aspects include etching by a dry etch process. Other aspects include forming the first trench to a width of about 2 micrometer (µm) and the second trench to a width of 0.5 µm to 1 µm.

Another aspect includes forming the second polysilicon layer by: depositing a second polysilicon material over the nitride layer, filling the first trench, and above the EPI layer in the second trench; and etching the second polysilicon material down to an upper surface of the nitride layer. Further aspects include etching the second polysilicon material by a dry etch process.

Another aspect include forming the dielectric layer, the first polysilicon layer and the second polysilicon layer using a furnace oxidation process and a sub-atmospheric chemical vapor deposition (SACVD) process. Further aspects include the dielectric layer including linear oxide and tetraethylorthosilicate (TEOS). Additional aspects include forming the dielectric layer to a thickness of 2,000 Angstrom (Å) to 4,000 Å. Further aspects include forming the first polysilicon layer to a thickness of 15,000 Å to 20,000 Å. Other aspects include forming the second polysilicon layer to a thickness of 10,000 Å to 15,000 Å.

Another aspect of the present disclosure is a device including: a buried implant layer over a substrate; an EPI layer over the buried implant layer; an oxide layer over the EPI layer; a nitride layer over the oxide layer; a DTI trench and a DTI-capacitor (DTI-CAP) trench in the nitride layer, the oxide layer, the EPI layer, the buried implant layer and the substrate, the DTI trench being wider and deeper than the DTI-CAP trench; a dielectric layer on sidewalls of the DTI trench and on side and bottom surfaces of the DTI-CAP trench below an upper surface of the EPI layer; a first polysilicon layer over the dielectric layer; and a second polysilicon layer filling the DTI trench and above the upper surface of the EPI layer in the DTI-CAP trench.

Aspects of the device include the DTI trench having a width of about 2 Other aspects include the DTI-CAP region having a trench of 0.5 µm to 1 Å further aspect includes the dielectric layer having a thickness of 2,000 Å to 4,000 Å. Additional aspects include the first polysilicon layer having a thickness of 15,000 Å to 20,000 Å. A further aspect includes the second polysilicon layer having a thickness of 10,000 Å to 15,000 Å.

Another aspect of the present disclosure is a method including: forming an N type buried implant (BN+) layer to a thickness of 3 µm to 4 µm over a p-type substrate; epitaxially growing an N-type (N-EPI) layer to a thickness of about 7 µm over the BN+ layer; forming a pad oxide layer to a thickness of about 150 Å over the N-EPI layer; forming a silicon nitride ($Si_3N_4$) layer to a thickness of about 1300 Å over the pad oxide layer; etching the $Si_3N_4$ layer, the pad oxide layer, the N-EPI layer, the BN+ layer and the p-substrate to form a DTI trench having a width of about 2 μm and a DTI-CAP trench having a width of 0.5 μm to 1 μm; forming a dielectric layer to a thickness of 2,000 Å to 4,000 Å over the $Si_3N_4$ layer, in the DTI trench, and in the DTI-CAP trench; forming a first polysilicon layer to a thickness of 15,000 Å to 20,000 Å over the dielectric layer; dry etching the first polysilicon layer and the dielectric layer using a dry etching process over the $Si_3N_4$ layer, above an upper surface of the N-EPI layer in the DTI trench and the DTI-CAP trench, and at a bottom of the DTI trench; forming a second polysilicon layer to a thickness of 10,000 Å to 15,000 Å over the $Si_3N_4$ layer, above an upper surface of the N-EPI layer in the DTI-CAP trench, and filling the DTI trench; and dry etching the second polysilicon layer down to an upper surface of the $Si_3N_4$ layer. Further aspects include the dielectric layer including linear oxide and TEOS.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1F schematically illustrates a process flow for forming a trench capacitor using a double-poly process, in accordance with an exemplary embodiment.

DETAILED DESCRIPTION

Figure 1A:
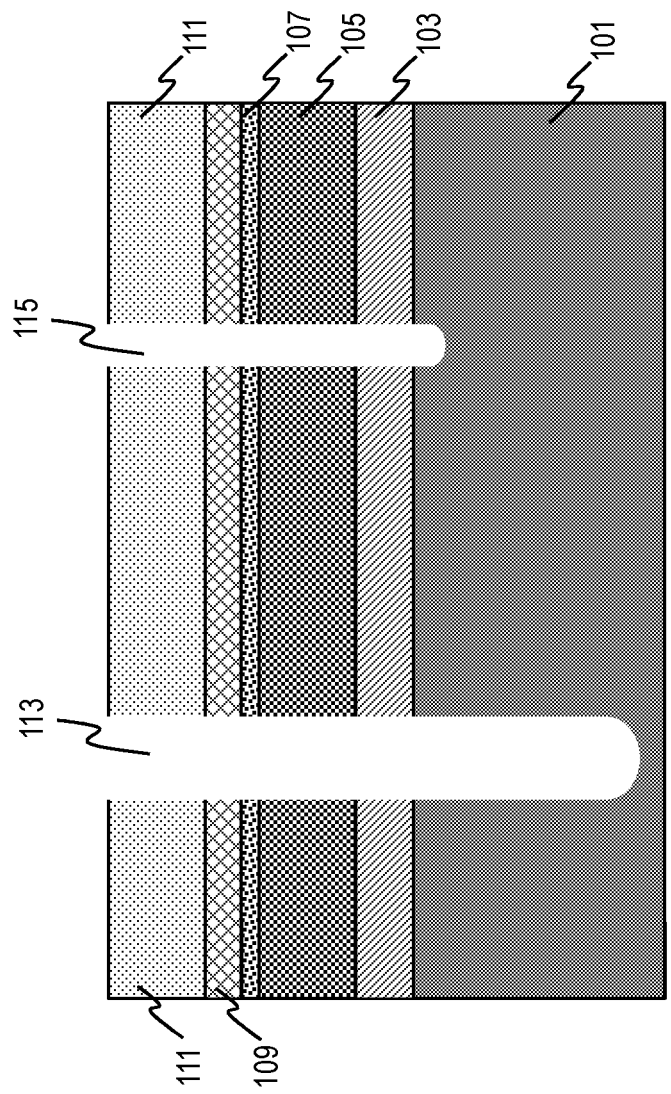

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an additional mask adder, thereby adding cost and complexity, attendant upon using a trench capacitor for a power capacitor. In accordance with embodiments of the present disclosure, the existing DTI process is utilized to form a power trench capacitor.

Methodology in accordance with embodiments of the present disclosure includes forming a buried implant layer over a substrate and an EPI layer over the buried implant layer. Next, an oxide layer is formed over the EPI layer, and a nitride layer is formed over the oxide layer. Subsequently, two trenches are formed in the nitride layer, the oxide layer, the EPI layer, the buried implant layer and the substrate. One trench is wider and deeper than the other trench. A dielectric layer is formed in the two trenches, and a first polysilicon layer is formed over the dielectric layer. Thereafter, the first polysilicon layer and the dielectric layer above the EPI layer in the two trenches and at a bottom of the wider trench are removed. Finally, a second polysilicon layer is formed filling the wider trench and above the EPI layer in the narrower trench.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1A through 1F schematically illustrates a process flow for forming a trench capacitor using a double-poly process, in accordance with an exemplary embodiment. Adverting to FIG. 1A, an N-type buried implant (BN+) layer 103 is formed to a thickness of 3 μm to 4 μm over a p-type substrate 101 having a bulk resistivity of 8 to 12 ohm-centimeters (Ω-cm). The BN+ layer 103 includes implants of arsenic and/or phosphors. An N-type epitaxial (N-EPI) layer 105 is formed to a thickness of about 7 μm over the BN+ layer 103. Then, a pad oxide layer 107 is formed to a thickness of about 150 Å over the N-EPI layer 105. A nitride layer 109 is formed to a thickness of about 1300 Å over the pad oxide layer 107. The nitride layer 109 is formed, for example, of silicon nitride ($Si_3N_4$). Next, a photoresist 111 is formed and patterned over the nitride layer 109, and the nitride layer 109, the oxide layer 107, the N-EPI layer 105, the BN+ layer 103 and the p-substrate 101 are etched using deep reactive ion etching (DRIE) to form two trenches, 113 and 115. Trench 113 is formed to a width of 2 and trench 115 is formed to a width of 0.5 μm to 1 μm. Trench 113 is a DTI sitting in an STI, and trench 115 is a DTI-CAP located in an active area. Trench 113 extends deeper into the substrate than trench 115.

Figure 1B:
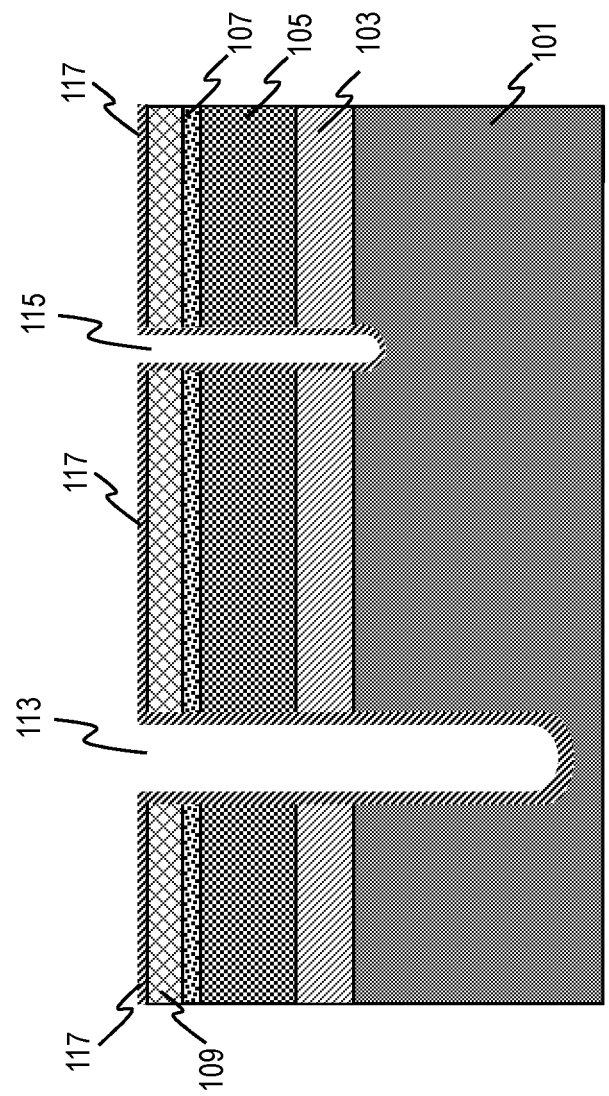
Figure 1C:
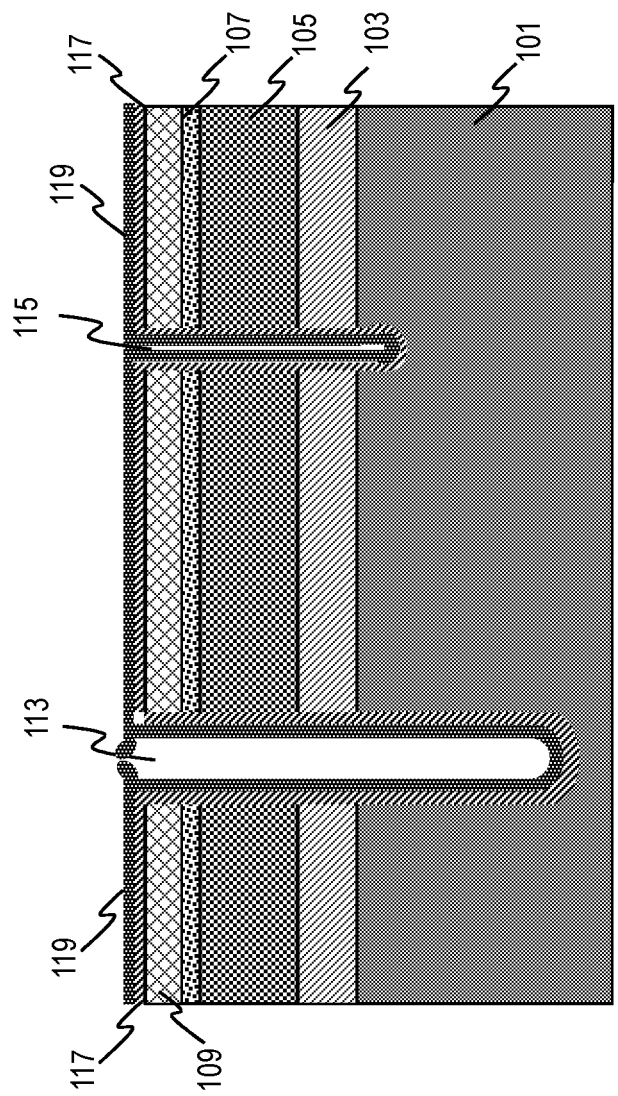

As illustrated in FIG. 1B, a dielectric layer 117 is conformally deposited, for example, to a thickness of 2,000 Å to 4,000 Å, in trench 113 and trench 115. The dielectric layer includes linear oxide formed by a furnace oxidation process and TEOS formed by a SACVD process. Adverting to FIG. 1C, a polysilicon layer 119 is deposited, e.g., to a thickness of 15,000 Å to 20,000 Å, over the dielectric layer 117 in trench 113 and trench 115. Next, in FIG. 1D, the dielectric layer 117 and the first polysilicon layer 119 are etched back by a dry etch process to an upper surface of the nitride layer 109. In addition, the dielectric and polysilicon are etched from inside trenches 113 and 115 down to an upper surface of the N-EPI layer 105 as well as from the bottom of trench 113. The polysilicon layer 119 and the dielectric layer 117 above the upper surface of the N-EPI layer 105 layer in trench 113 and trench 115 and at the bottom of trench 113 are etched concurrently with the dielectric layer and the first polysilicon layer above the nitride layer 109.

Figure 1E:
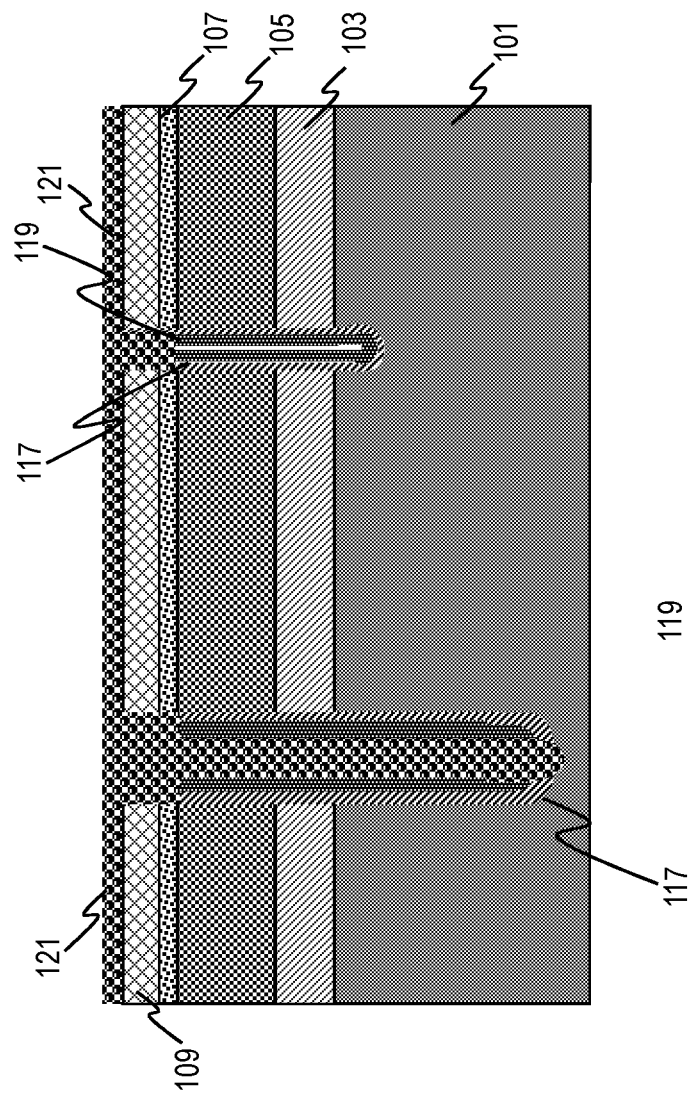
Figure 1F:
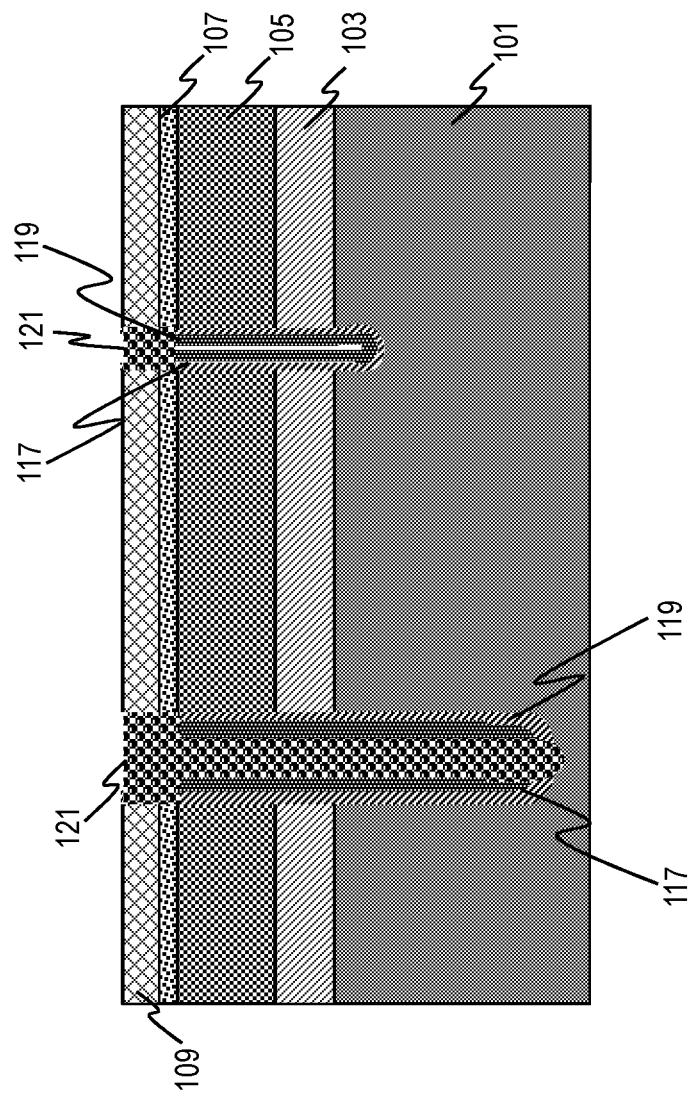

As illustrated in FIG. 1E, a polysilicon layer 121 is deposited to a thickness of 10,000 Å to 15,000 Å over nitride layer 109, filling trench 113, and above the N-EPI layer 105 in trench 115. Then, the second polysilicon layer 121 is etched by a dry etch process down to an upper surface of the nitride layer 109, as illustrated in FIG. 1F. As a result, a DTI-capacitor is formed in trench 115, with the N-EPI layer 105 as a bottom plate and polysilicon layers 119 and 121 as a top plate.

The embodiments of the present disclosure can achieve several technical effects including a trench capacitor that can concurrently achieve high capacitance density and low leakage without requiring an extra mask (and therefore extra cost and complexity) for its fabrication. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a buried implant layer over a substrate;
   an epitaxial (EPI) layer over the buried implant layer;
   an oxide layer over the EPI layer;
   a nitride layer over the oxide layer;
   a deep trench isolation (DTI) and a DTI-capacitor (DTI-CAP) in the nitride layer, the oxide layer, the EPI layer, the buried implant layer and the substrate, the DTI being wider and deeper than the DTI-CAP;
   a dielectric layer on sidewalls of the DTI and on side and bottom surfaces of the DTI-CAP below an upper surface of the EPI layer;
   a first polysilicon layer over the dielectric layer in the DTI and DTI-CAP; and
   a second polysilicon layer filling the DTI and above the upper surface of the EPI layer in the DTI-CAP,
   wherein the EPI layer is a bottom plate of the DTI-CAP and the first and second polysilicon layers are a top plate of the DTI-CAP.

2. The device according to claim 1, wherein the DTI trench has a width of about 2 micrometer (μm).

3. The device according to claim 1, wherein the DTI-CAP region has a trench of 0.5 μm to 1 μm.

4. The device according to claim 1, wherein the dielectric layer has a thickness of 2,000 Angstrom (Å) to 4,000 Å.

5. The device according to claim 1, wherein the first polysilicon layer has a thickness of 15,000 Å to 20,000 Å.

6. The device according to claim 1, wherein the second polysilicon layer has a thickness of 10,000 Å to 15,000 Å.

7. The device according to claim 1, wherein the buried implant layer comprises an N-type buried implant (BN+) layer formed over a p-type substrate.

8. The device according to claim 7, wherein the epitaxial layer comprises an N-type epitaxial (N-EPI) layer over the BN+ layer.

9. The device according to claim 1, wherein the silicon nitride layer comprises $Si_3N_4$ over the oxide layer.

10. The device according to claim 1, wherein the dielectric layer comprises linear oxide and tetraethylorthosilicate (TEOS).

11. A device comprising:
    an N-type buried implant (BN+) layer formed over a p-type substrate;
    an N-type epitaxial (N-EPI) layer over the BN+ layer;
    a pad oxide layer over the N-EPI layer;
    a silicon nitride ($Si_3N_4$) layer over the pad oxide layer;
    a deep trench isolation (DTI) trench and a DTI-capacitor (DTI-CAP) trench, wherein the DTI trench is wider and deeper than the DTI-CAP trench;
    a dielectric layer over the $Si_3N_4$ layer, in the DTI trench, and in the DTI-CAP trench;
    a first polysilicon layer over the dielectric layer; and
    a second polysilicon layer over the $Si_3N_4$ layer, above an upper surface of the N-EPI layer in the DTI-CAP trench, and filling the DTI trench.

12. The device according to claim 11, wherein the dielectric layer comprises linear oxide and tetraethylorthosilicate (TEOS).

13. The device according to claim 11, wherein the first trench has a width of about 2 micrometer (μm) and the second trench has a width of 0.5 μm to 1 μm.

14. The device according to claim 11, wherein the dielectric layer has a thickness of 2,000 Angstrom (Å) to 4,000 Å.

15. The device according to claim 11, wherein the first polysilicon layer has a thickness of 15,000 Å to 20,000 Å.

16. The device according to claim 11, wherein the second polysilicon layer has a thickness of 10,000 Å to 15,000 Å.

17. The device according to claim 11, wherein the N-EPI layer is a bottom plate of the DTI-CAP.

18. The device according to claim 11, wherein the first and second polysilicon layers are a top plate of the DTI-CAP.

* * * * *